(12) United States Patent
Yoshikawa

(10) Patent No.: US 6,735,710 B1
(45) Date of Patent: May 11, 2004

(54) CLOCK EXTRACTION DEVICE

(75) Inventor: Takefumi Yoshikawa, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 693 days.

(21) Appl. No.: 09/655,717

(22) Filed: Sep. 5, 2000

(30) Foreign Application Priority Data

Sep. 9, 1999 (JP) .......................... 11-255030

(51) Int. Cl.[7] ................................. G06F 1/04
(52) U.S. Cl. ................. 713/500; 713/503; 713/600
(58) Field of Search ............... 713/500, 503, 713/600, 375, 376, 355; 375/375, 376, 355

(56) References Cited

U.S. PATENT DOCUMENTS

| | | | |
|---|---|---|---|
| 4,972,161 A | * 11/1990 | Davies et al. | 331/1 A |
| 5,761,255 A | * 6/1998 | Shi | 375/360 |
| 6,081,561 A | * 6/2000 | Julyan et al. | 375/340 |
| 6,154,511 A | * 11/2000 | Nakamura et al. | 375/375 |
| 6,229,859 B1 | * 5/2001 | Jeong et al. | 375/354 |

FOREIGN PATENT DOCUMENTS

| | | | |
|---|---|---|---|
| JP | 63199530 A | * 8/1988 | H04B/9/00 |
| JP | 5-56025 | 3/1993 | |
| JP | 5-268208 | 10/1993 | |
| JP | 7-58790 | 3/1995 | |
| JP | 7-336343 | 12/1995 | |
| JP | 9-83500 | 3/1997 | |
| JP | 9-247139 | 9/1997 | |
| JP | 10-56446 | 2/1998 | |

OTHER PUBLICATIONS

Langhe et al, A Clock/Data Extraction Device for use in ATM Electro–optical Network, 1993 IEEE, pp. 362–365.*
"A 0.6$\mu$m CMOS 4Gb/s Transceiver with Data Recovery Using Oversampling" by Yang et al., 1997 Symposium on VLSI Circuits Digest of Technical Papers, pp. 71–72.

* cited by examiner

Primary Examiner—Dennis M. Butler
Assistant Examiner—Suresh K Suryawanshi
(74) Attorney, Agent, or Firm—McDermott, Will & Emery

(57) ABSTRACT

Incoming serial data is quantized by 3-times oversampling to obtain a first datastream. By the EXOR of adjacent bits in the datastream, a second datastream which specifies transient points in the first datastream is produced from the first datastream. Reference is made to the third bit from each transient point in the second datastream and to bits positioned on each side of the third bit. If there exists no transient point in any one of these two bits, then the third bit is a boundary. On the other hand, if there exists a transient point in either of the two bits, the bit where the transient point exists is a boundary. In this way, a third datastream is produced. Then, the time-series EXOR of the third datastream and a clock bitstream is performed to produce a final clock bitstream.

11 Claims, 18 Drawing Sheets

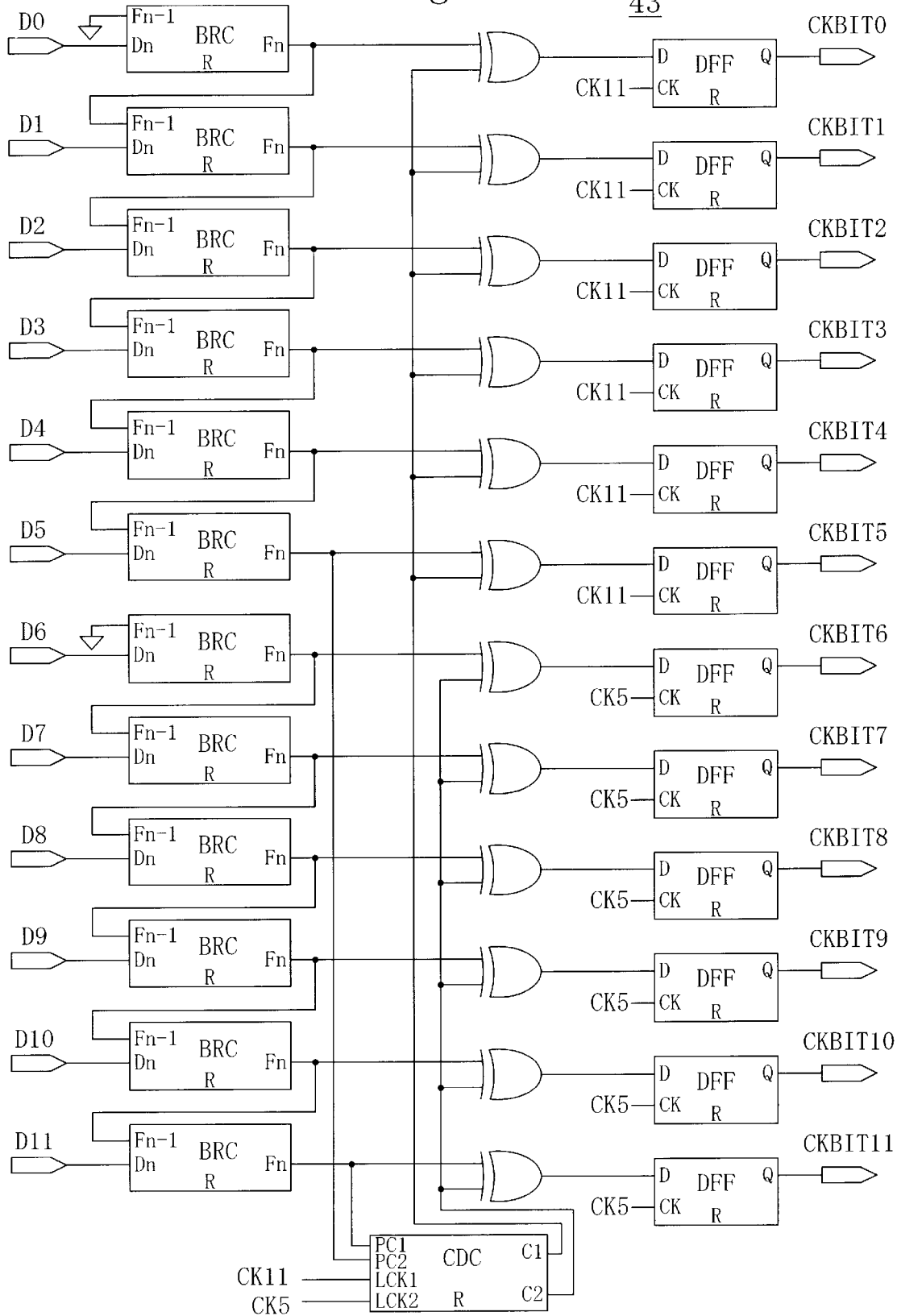

Fig. 11A  TRANSIENT DETECTION CELL (TDC)
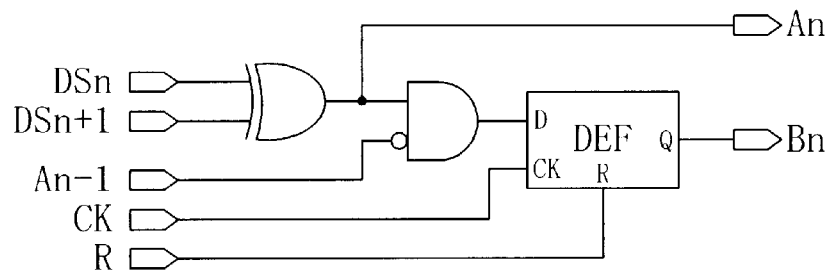
Fig. 11B  BOUNDARY MARKING CELL (BMC)
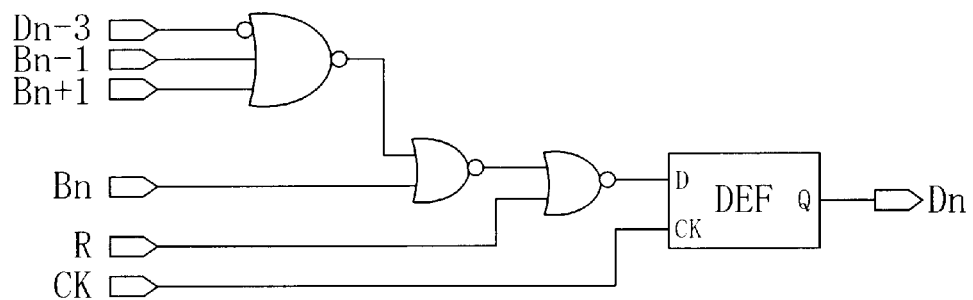
Fig. 11C  BIT RECOVERY CELL (BRC)
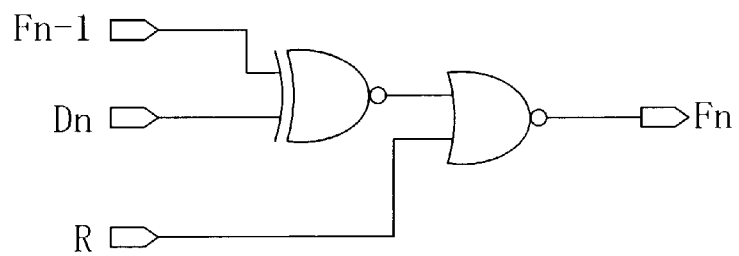

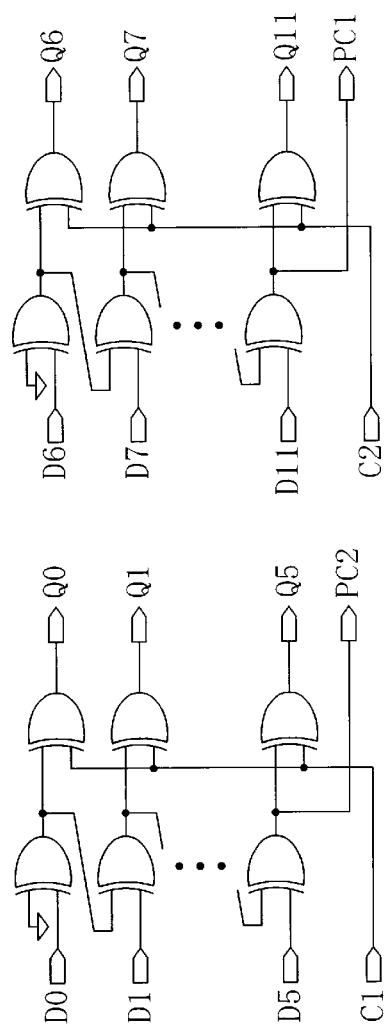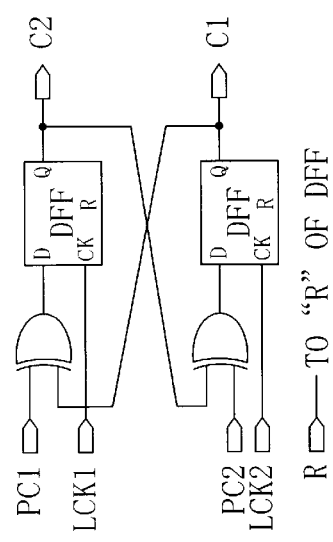
Fig. 14A  C1=false(PC1=C2), C2=false(PC2=C1)
Fig. 14B  CARRY DETECTION CELL (CDC)
R ▷— TO "R" OF DFF

CLOCK EXTRACTION DEVICE

BACKGROUND OF THE INVENTION

The present invention relates to a clock extraction device for generating from incoming data a clock in synchronization therewith.

With the rapid spread of multimedia, there have been increasing demands for transmission of large amounts of data at high speed. As means to meet such demands, high-speed serial data interfaces, such as IEEE 1394 and Gigabit Ethernet, and Fibre Channel, have lately attracted considerable attention. In these interface techniques, only data is transmitted from the sending side at a high transmission rate (for example, 1 Gbps) and the phase-locked loop (PLL) on the receiving side generates a clock in perfect sync with such high-speed data. Then, the high-speed data is latched and received on the receiving side by the generated clock. Such technology reduces the skew between clock and data as compared with conventional interfaces designed to transmit both a clock and data, for speeding up the transmission of data.

The IEEE 1394 Std. provides a configuration in which a single interface LSI (physical layer LSI) has a plurality of I/O ports. However, as described above, synchronization of incoming data with a latch clock for the incoming data is established by a receiving-side PLL and the ports, in fact, receive their respective input data at slightly different frequencies (several hundreds of ppm), so that each port requires a PLL for synchronization. In other words, in accordance with the IEEE 1394 Std., one chip is required to carry a corresponding number of PLLs to the number of ports. This accordingly leads to increase in power consumption and in heat release amount. It therefore becomes impossible to seal the chip into a plastic package and, in addition, there is a considerable increase in chip area. This produces the problem that reductions in costs are difficult to achieve.

When performing serial transmission of burst data from a sending-side driver to a receiving-side receiver through a transmission line, the data is generally latched by an internal clock of the receiver. However, the burst data has a burst interval, so that even if the phase relationship of clock versus data is proper at one point in time the timing relationship of data versus clock will deviate during the burst interval. Because of this, there is a possibility of the occurrence of improper latching.

With a view to being able to avoid such a problem, in conventional burst data transmission techniques, when transmitting the next data upon completion of the burst interval, a preamble period is provided prior to the transmission. This allows the receiver to perform phase adjustment on a clock during the preamble period. During the preamble period, actual data is not transmitted. That is, the preamble-period serves as a period used mainly for clock-to-data phase adjustment on the receiver side. This degrades the efficiency of data transmission.

SUMMARY OF THE INVENTION

Accordingly, an object of the present invention is to make it possible to achieve extraction of different clocks corresponding to a plurality of input ports respectively with a single PLL, thereby to prevent the number of PLLs in an LSI from increasing even when the number of input ports increases.

Further, another object of the present invention is to eliminate a preamble period used for phase adjustment in transmitting burst data in conventional techniques, for improving the efficiency of data transmission.

In order to provide a solution to the above-described drawback, the present invention discloses a clock extraction device comprising a data sampler part for quantizing incoming serial data by N times oversampling where N is a predetermined number, a data divider part for dividing a datastream obtained by quantization in the data sampler part into a plurality of groups on the basis of transient points in the datastream and of the number N, and a clock generator part for generating a clock on the basis of boundaries of the plurality of groups obtained by the data divider part.

In the clock extraction device of the present invention, input data is quantized by N times oversampling to produce a datastream. Then, the datastream is divided into a plurality of groups on the basis of transient points in the datastream and of the predetermined number N. That is to say, when the data varies for every one cycle, transient points of the datastream exhibit a data cycle, and grouping of a datastream is carried out at the data cycle. Further, when the data does not vary for some cycles, datastream grouping is basically carried out for every N data bits. Then, a clock is generated on the basis of boundaries of the groups of the datastream. Extraction of a clock matched with the data cycle is thus achieved.

Such clock extraction provides the following advantages: (1) A transient point of the datastream is used as a basis, so that the cycle of data specified by oversampling (sample rate×N) does not necessarily match with that of actual input data in the order of ppm; (2) Adjustment in clock phase is automatically carried out using a transient point of the datastream as a basis, so that extraction of a clock matched with the data input timing is performed in order to ensure that, even when asynchronous, sudden burst data is input, the data is received in safe and reliable manner from the first bit thereof; and (3) A series of such processes can be implemented by application of digital processing for each port at which input data is received (although generation of a clock for oversampling is carried out by means of PLL), so that the provision of a single PLL suffices, regardless of the number of ports.

The present invention discloses another clock extraction device comprising a data sampler part for quantizing incoming serial data by N times oversampling where N is a predetermined number, a first converter part for producing from a first datastream obtained by quantization in the data sampler part a second datastream which specifies transient points in the first datastream, a second converter part for producing from the second datastream a third datastream which specifies boundaries based on transient points in the second datastream and on the number N, and a clock generator part for generating a clock on the basis of boundaries in the third datastream. Such arrangement therefore makes it possible to divide the processing necessary for the extraction of a clock into three process steps, namely, a process of producing a first datastream, a process of producing a second datastream, and a process of producing a third datastream. Accordingly, if the production of each datastream is performed by pipeline, this reduces the load of each process, making it possible to handle high-speed input data.

Further, the third datastream is produced by (a) making reference to an N-th bit from each of the transient points in the second datastream and to bits in front of and behind the N-th bit, (b) if there exists no transient point in any one of the bits, determining the N-th bit as a boundary, and (c) if there exists a transient point in either one of the bits, determining the transient point bit as a boundary. As a result of such arrangement, the bits on each side of the N-th bit are referred to. Accordingly, even when a transient point of the datastream fails to perfectly agree with the N-th bit because of the presence of jitter in the input data, it is possible to achieve adequate clock extraction.

Furthermore, an arrangement may be made in which the third datastream has boundary bits different in logical value from the other bits and the clock is generated by a time-series EXOR of bits in the third datastream. As a result of such arrangement, clock generation is achieved by a relatively simple logic circuit.

The present invention provides a serial-parallel conversion device comprising: (i) a clock extraction circuit including (a) a data sampler part for quantizing incoming serial data by N times oversampling where N is a predetermined number, (b) a first converter part for producing from a first datastream obtained by quantization in the data sampler part a second datastream which specifies transient points in the first datastream, (c) a second converter part for producing from the second datastream a third datastream which specifies boundaries based on transient points in the second datastream and on the number N, and (d) a clock generator part for generating a clock on the basis of boundaries in the third datastream, (ii) a data recovery circuit for recovering the input data from the first datastream, and (iii) a demultiplex circuit for expanding, based on the input data recovered by the data recovery circuit and on the clock extracted by the clock extraction circuit, the input data into a predetermined number of bits.

In the serial-parallel conversion device of the present invention, both the clock generated by the clock extraction circuit and the input data recovered by the data recovery circuit are generated based on the first datastream, so that they are in perfect synchronization with each other. Accordingly, data expanded in the demultiplex circuit by the use of these synchronized clock and data is highly reliable.

In another serial-parallel conversion device of the present invention, a pattern decision circuit sequentially receives expanded data. When the pattern decision circuit determines that there exists a specific pattern in the expanded data received or that there exists a specific pattern extending over not less than two items of expanded data, a data shift circuit shifts the expanded data so that the specific pattern is output at a time as a predetermined number of bits. As a result of such arrangement, for the case of parallel expansion of serial data, alignment is made by the specific pattern and the serial data is set apart for a predetermined number of bits. Accordingly, by appropriate insertion of the specific pattern during the transmission of serial data, it becomes possible to align the expanded data at the receiving side as intended by the sending side.

For example, when the sending side transmits data by 10:1 parallel-serial conversion (the predetermined number of bits is ten), if the data is serially transmitted by parallel-serial conversion from the sending side wherein a specific pattern of ten bits is formed of a bitstream of 1111111111 on the communication condition that 1 does not continue for ten bits, then the data received after the specific pattern (1111111111) and serial-parallel converted is aligned by the specific pattern to become the same 10-bit data at the sending side. This is extremely convenient because, when 10-bit data is sequentially subjected to digital processing at the receiving side, the data (for example, a packet) from the sending side is reproduced remaining intact.

Further, if encoding, such as 8B10B/10B8B, is applied to serial data that is sent, in other words, if a decode circuit is disposed for decoding data encoded at the sending side and expanded by the demultiplex circuit, this provides various types of unique patterns. Accordingly, an adequate pattern in objective communication can be set as the specific pattern.

Furthermore, when the input data is burst data, if a specific pattern is assigned during a preamble period provided at the beginning of a burst period and used for establishing synchronization between the data and an internal clock, then data alignment can be carried out during the preamble period in which no actual data is transmitted. This improves the efficiency of burst data transmission.

A suitable data receiver can be constructed of a plurality of serial-parallel conversion devices of the present invention wherein these conversion devices are operated by a clock from a common PLL.

BRIEF DESCRIPTION OF THE DRAWINGS

FIG. 10 is a circuit diagram showing in detail the structure of a third converter part in FIG. 7.

FIG. 11A is a circuit diagram showing the internal structure of a transient detection cell (TDC) in FIG. 8, FIG. 11B is a circuit diagram showing the internal structure of a boundary marking cell (BMC) in FIG. 9, and FIG. 11C is a circuit diagram showing the internal structure of a bit recovery cell (BRC) in FIG. 10.

FIG. 14A is a circuit diagram for the description of the operation of the third converter part in FIG. 7 and FIG. 14B is a circuit diagram showing the internal structure of a carry detection cell (CDC) in FIG. 10.

DETAILED DESCRIPTION OF THE INVENTION

Embodiments of the present invention will be described with reference to the attached drawing figures.

Figure 1:
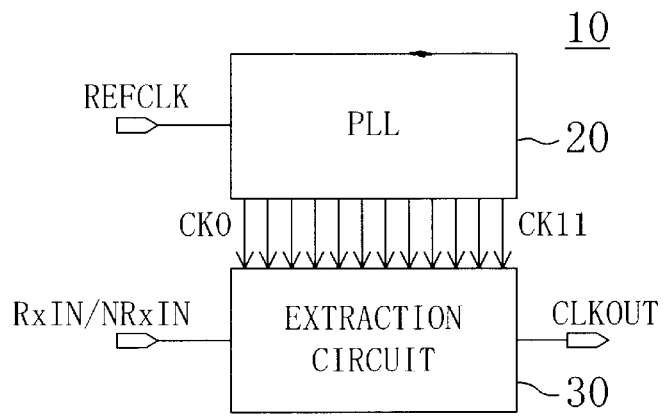
FIG. 1 is a block diagram showing an example of the entire structure of a clock extraction device according to the present invention.

FIG. 1 shows a clock extraction device 10 according to the present invention. The clock extraction device 10 comprises a PLL 20 for generation of 12-phased clocks CK0–11 on the basis of a reference clock REFCLK and an extraction circuit 30 for extraction of an output clock CLKOUT from serial input data RxIN and NRxIN by the use of the 12-phased clocks CK0–11.

Figure 2:
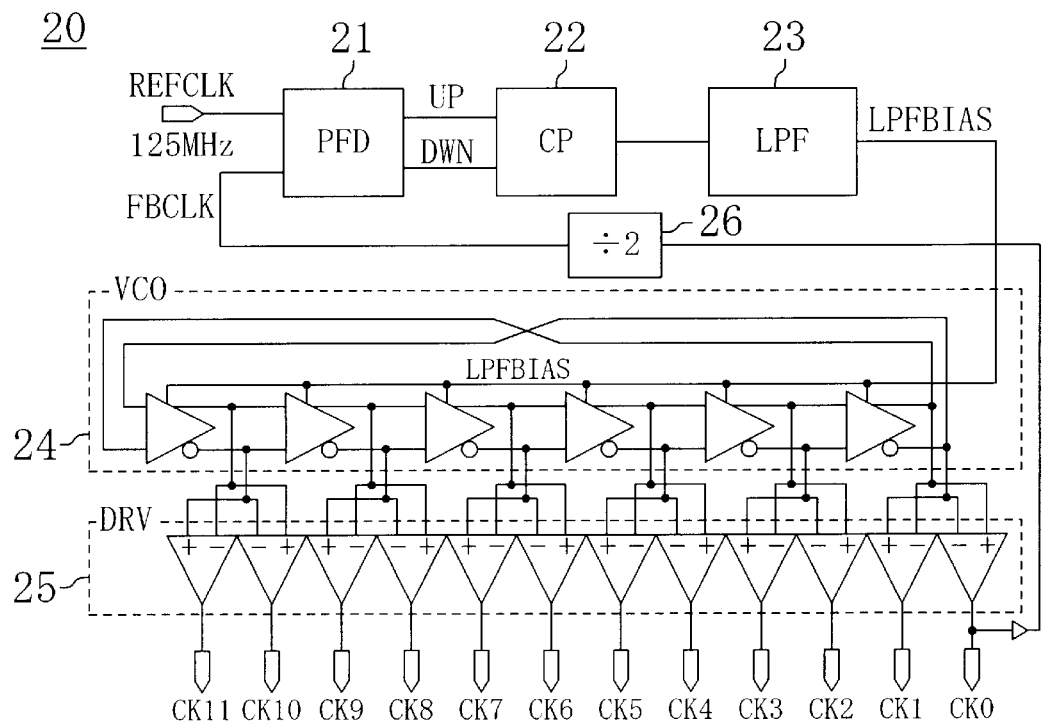
FIG. 2 is a block diagram showing in detail the structure of a PLL in FIG. 1.
Figure 3:
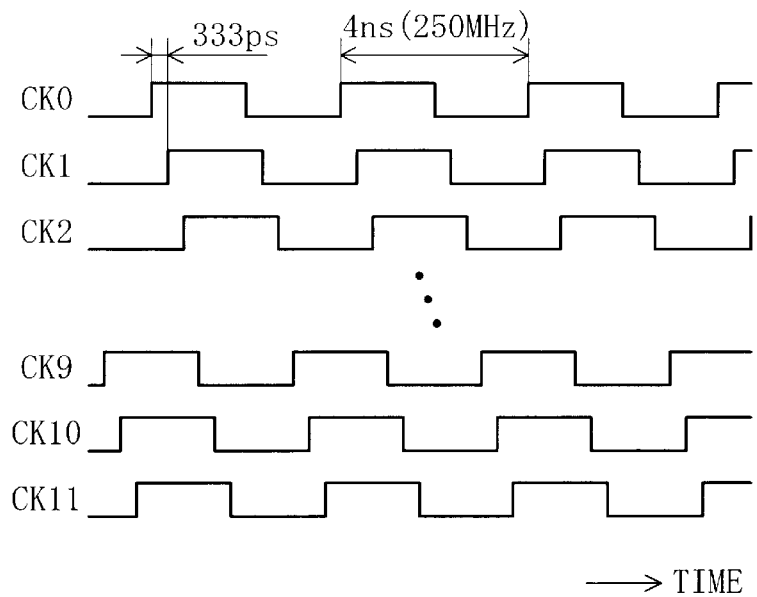
FIG. 3 is a diagram representative of the timing of 12-phased clocks generated by the PLL of FIG. 2.

As shown in FIG. 2, the PLL 20 causes a voltage controlled oscillator (VCO) 24 to perform 250-MHz oscillation by the reference clock REFCLK at 125 MHz and a ½ divider 26. Reference numeral 21 represents a phase detector (PFD), reference numeral 22 a charge pump(CP), and reference numeral 23 a low pass filter (LPF). In the VCO 24, six VCO cells are looped for generation of a 250-MHz clock and a positive and a negative signal are taken out of each of the cells. These signals are input to a differential input driver (DRV) 25 for generation of the 12-phased clocks CK0–11 as shown in FIG. 3. These clocks CK0–11 are fed to the extraction circuit 30. The difference in phase between each clock is 333 ps (⅓ ns).

Figure 4:
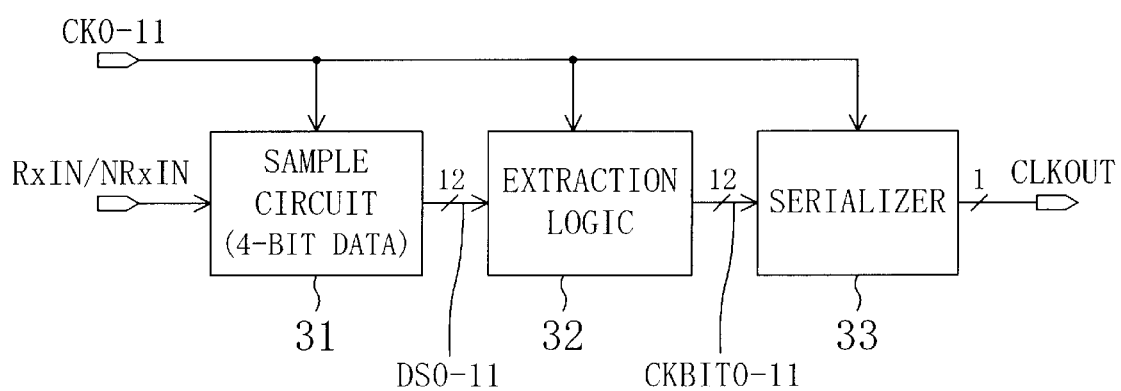
FIG. 4 is a block diagram showing the internal structure of an extraction circuit in FIG. 1.

As shown in FIG. 4, the extraction circuit 30 in FIG. 1 comprises a sample circuit 31, an extraction logic 32, and a serializer 33.

Figure 5:
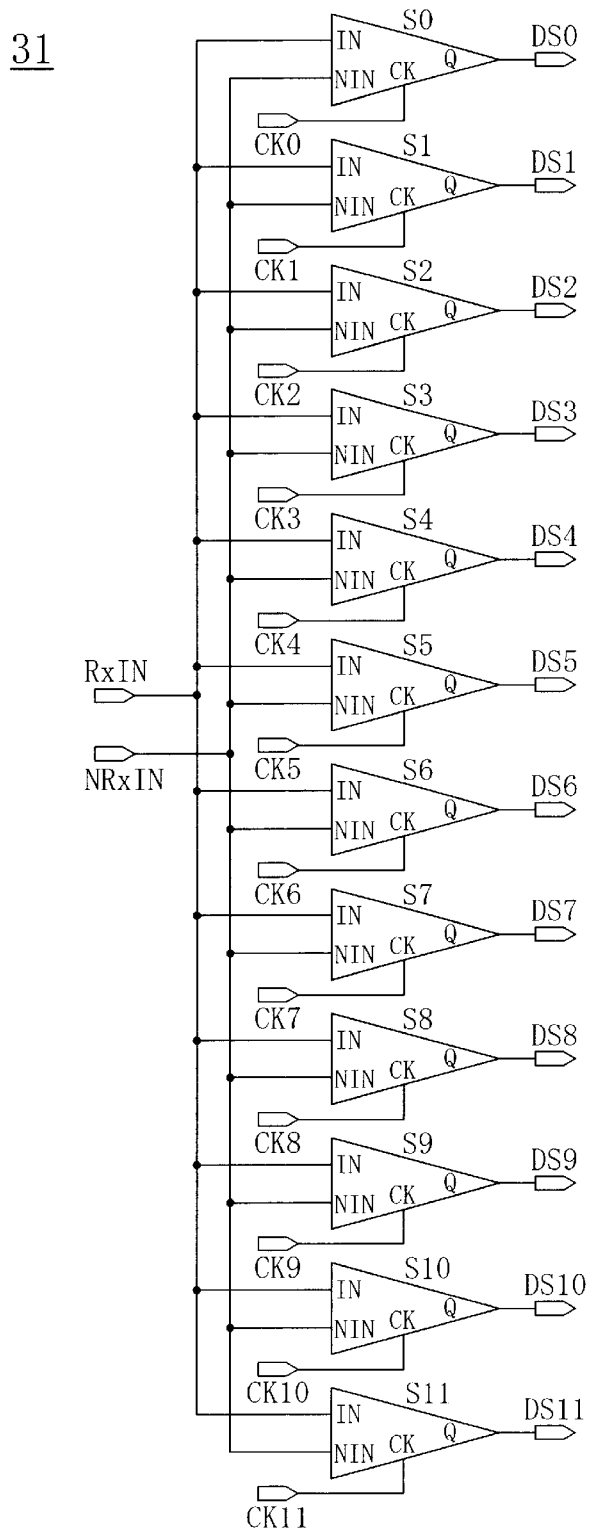
FIG. 5 is a circuit diagram showing in detail the structure of a sample circuit in FIG. 4.
Figure 6:
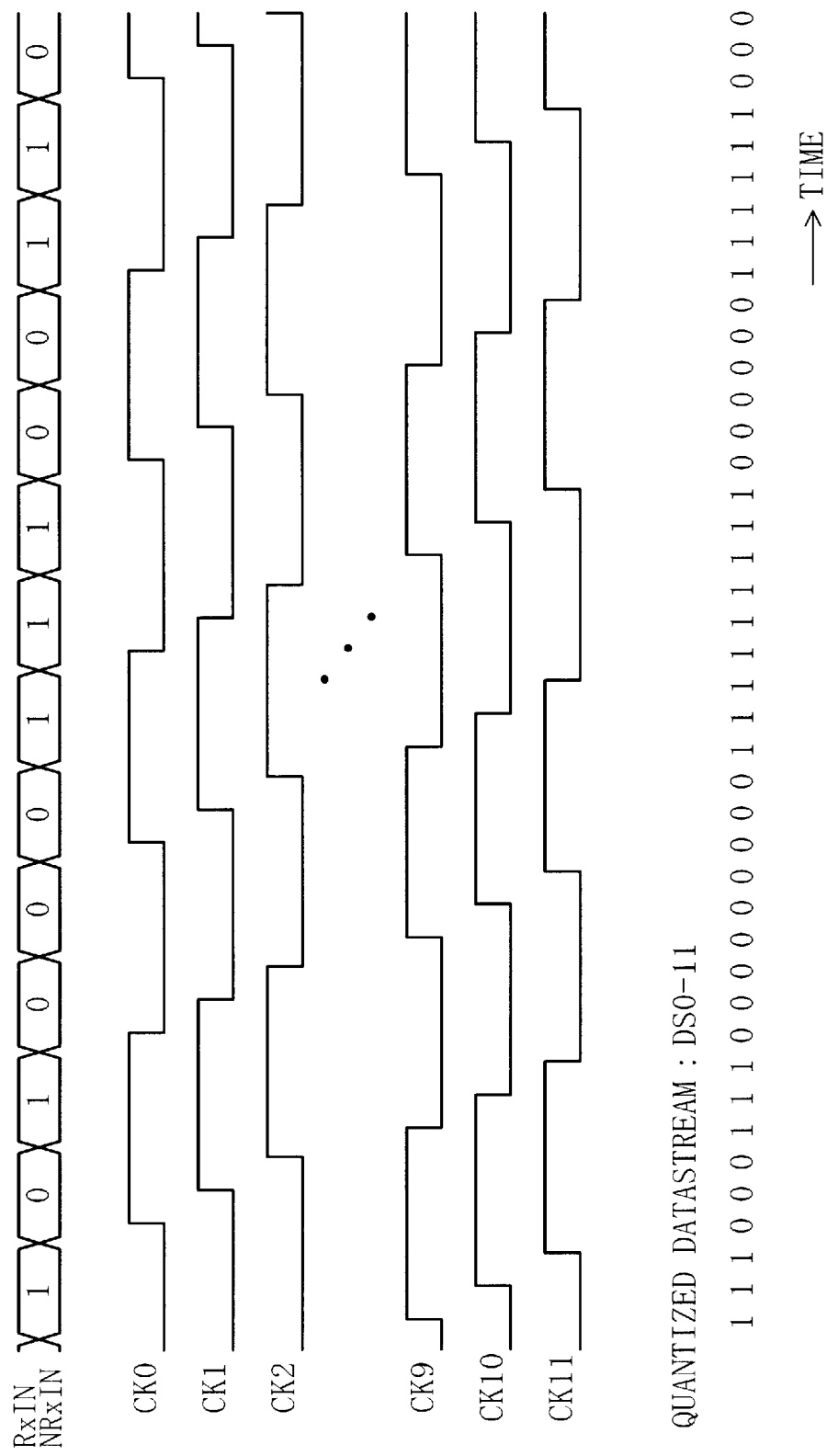
FIG. 6 is a diagram representative of the timing of data and clocks in the sample circuit of FIG. 5.
Figure 7:
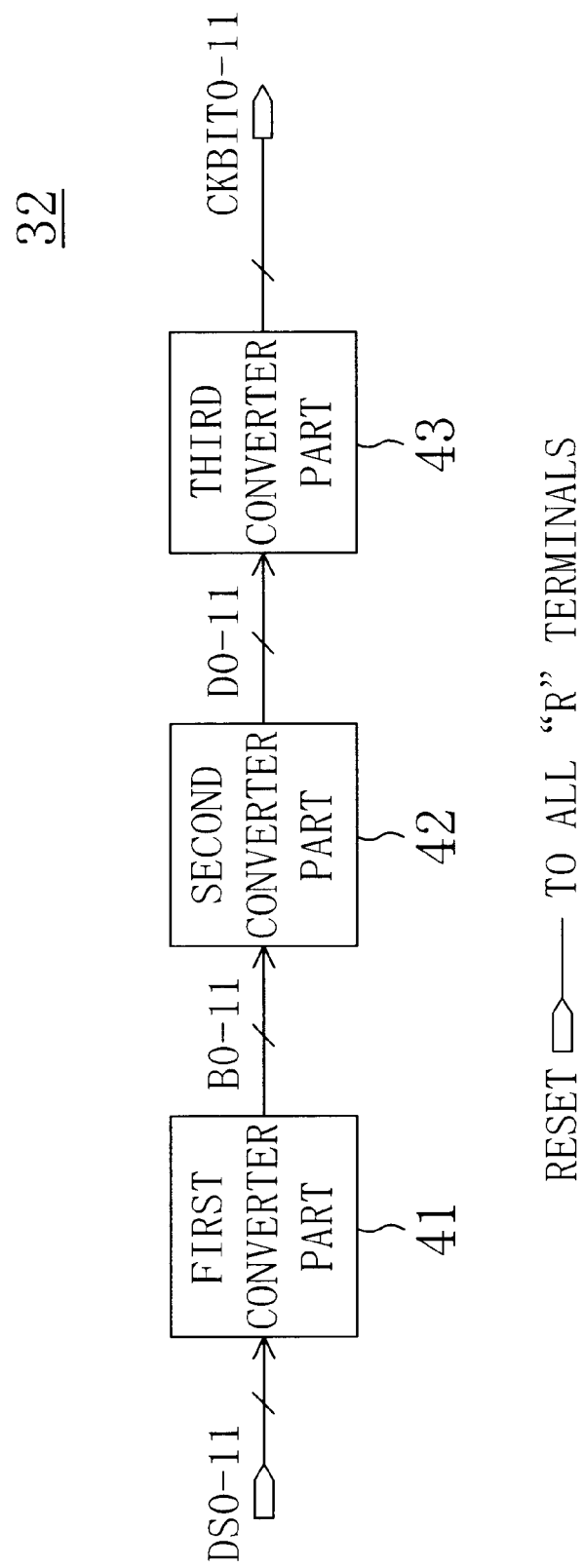
FIG. 7 is a block diagram showing in detail the structure of extraction logic in FIG. 4.
Figure 8:
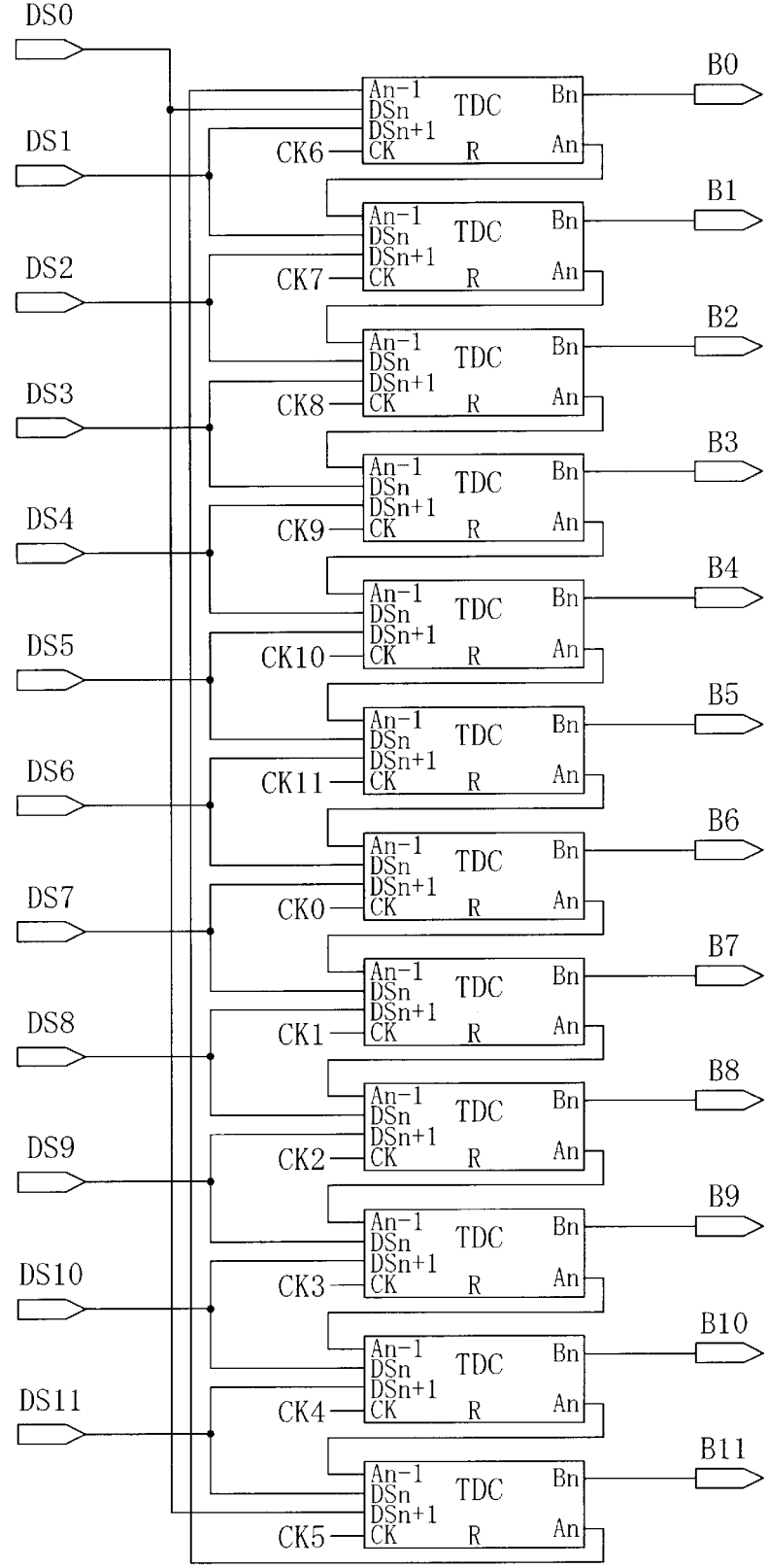
FIG. 8 is a circuit diagram showing in detail the structure of a first converter part in FIG. 7.
Figure 9:
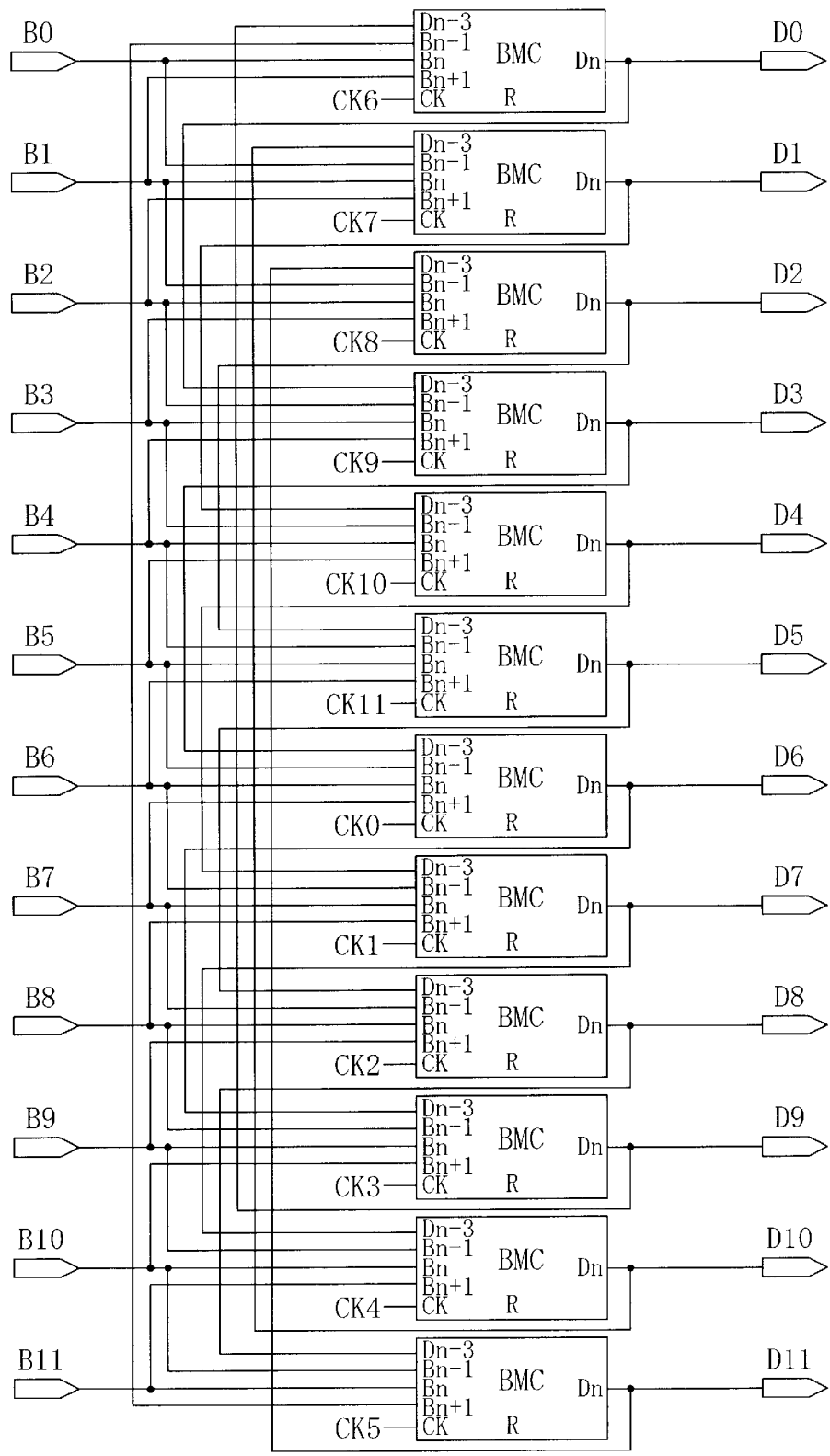
FIG. 9 is a circuit diagram showing in detail the structure of a second converter part in FIG. 7.

As shown in FIG. 5, the sample circuit 31 comprises twelve sample units S0–11. The sample circuit 31 performs three-times oversampling on the serial input data RxIN and NRxIN for every four consecutive units and produces a first datastream DS0–11 by time-series latching and quantizing the serial input data RxIN and NRxIN at the rising edge of the 12-phased clocks CK0–11 (see FIG. 6).

Figure 12:
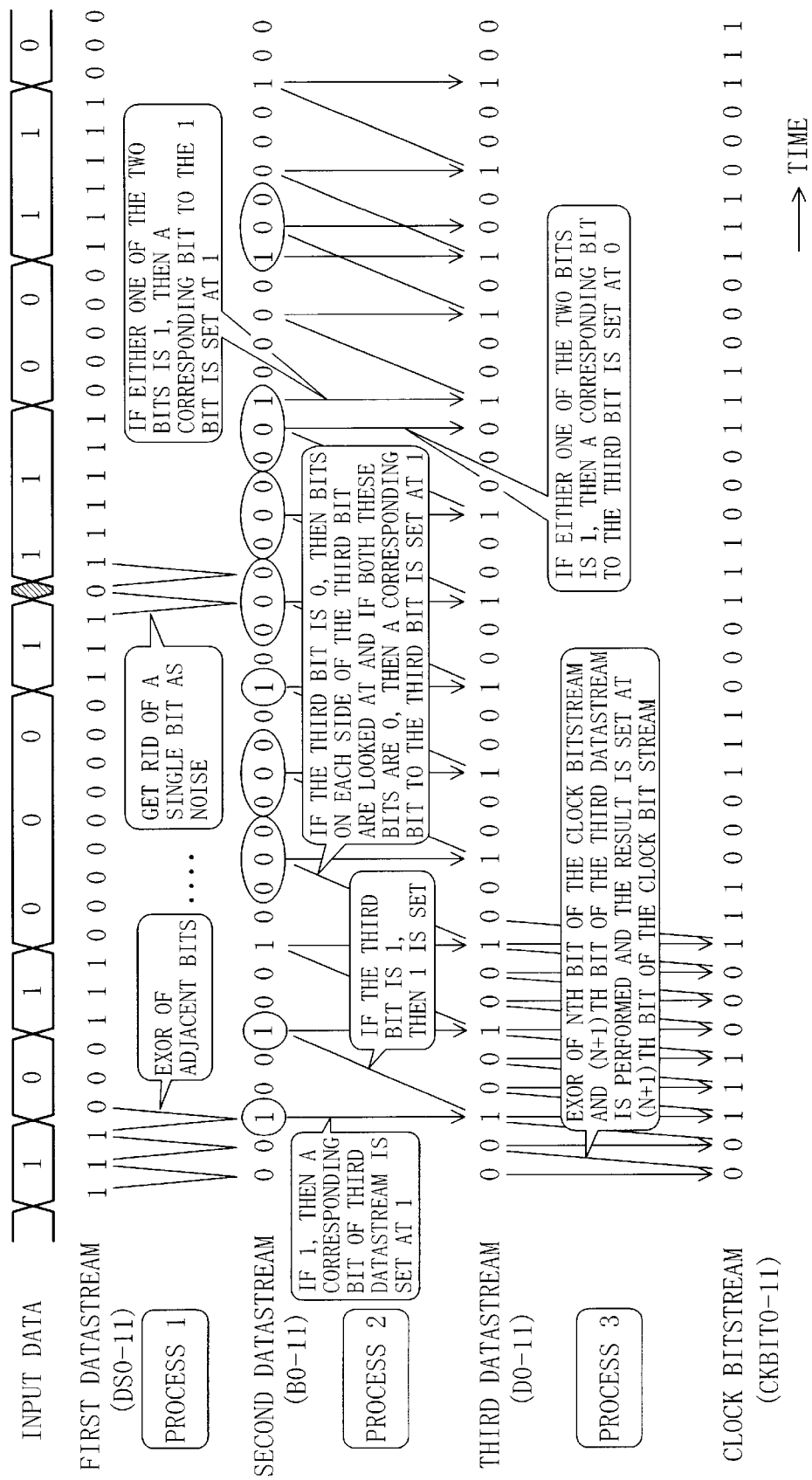
FIG. 12 is a explanatory diagram for the operation of the extraction logic of FIG. 7.

The extraction logic 32 having a structure as shown in FIGS. 7–10, 11A–C, and 14B performs PROCESS 1, PROCESS 2, and PROCESS 3 on the first datastream DS0–11 quantized in the sample circuit 31 by an algorithm shown in FIG. 12.

In PROCESS 1 by a first converter part 41, a transient detection cell (TDC) performs an EXOR of adjacent bits in the datastream DS0–11, thereby to produce a second datastream B0–11 which contains bits of different logical value at its transient points (i.e., only the transient points assume 1). If there exists only one isolated bit in the first datastream, such a bit is considered as noise and purged by the transient detection cell (TDC).

In PROCESS 2 by a second converter part 42, digital processing is carried out in a boundary marking cell (BMC) as shown in FIG. 11B. In the digital processing, a third datastream D0–11 is produced, as shown in FIG. 12. Each boundary in the third datastream D0–11 is represented by 1. That is, in the boundary preparation, because of the 3-times oversampling, a lookup at the third bit from a transient point (1) is first conducted in the second datastream. If the third bit is found to be a transient point (1), then a corresponding bit of the third datastream to the transient point is set at 1 as a boundary. If not, reference is made to bits in front of and behind the third bit. If both these bits are 0, then a corresponding bit of the third datastream to the third bit of the second datastream is set as a boundary (1). On the other hand, if either one of these two bits assumes 1, a corresponding bit of the third datastream to such a logical 1 bit is set as a boundary (1). In this case, the third bit is not set as a boundary (1) but remains intact as a bit of 0.

In PROCESS 3 by a third converter part 43, the time-series EXOR of the third datastream and a clock bitstream is implemented by a bit recovery cell (BRC) shown in FIG. 11C, thereby to produce a final clock bitstream CKBIT0–11.

Thereafter, the clock bitstream CKBIT0–11 is subjected to serialization by the serializer 33 in FIG. 4, thereby to generate a clock (double cycle). The clock extraction is now completed.

Figure 13:
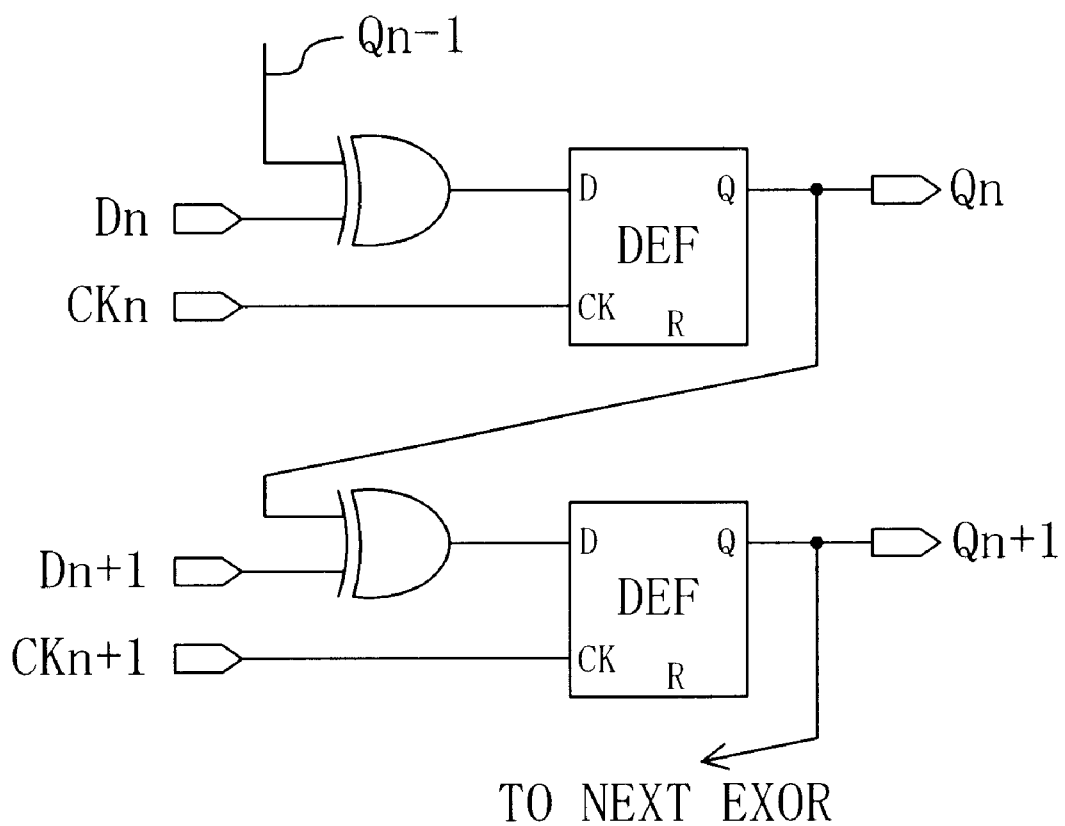
FIG. 13 is a circuit diagram showing an example for comparison with the structure of the third converter part in FIG. 7.

The EXOR processing in PROCESS 3 may be performed in a circuit as shown in FIG. 13. However, in such a circuit, it is required to carry out each EXOR processing and latching by a D flip flop (DFF) at a clock minimum interval (333 ps at 1 Gbps), and it is difficult to guarantee the setup- and hold-time of the DFF.

To cope with the above, in the third converter part 43, 12 EXOR cells are divided into two groups as shown in FIG. 14A and processing is carried out beforehand assuming that the first value (here, the final carry of the buddy group) is 0. If the carry of the buddy group is, in fact, not 0, then the result previously found is inverted. The result is latched by the DFF. Because of this, the latch time is extended six times to 2 ns, thereby ensuring safe processing. FIG. 14B shows the internal structure of a carry detection cell (CDC) in FIG. 10.

Figure 15:
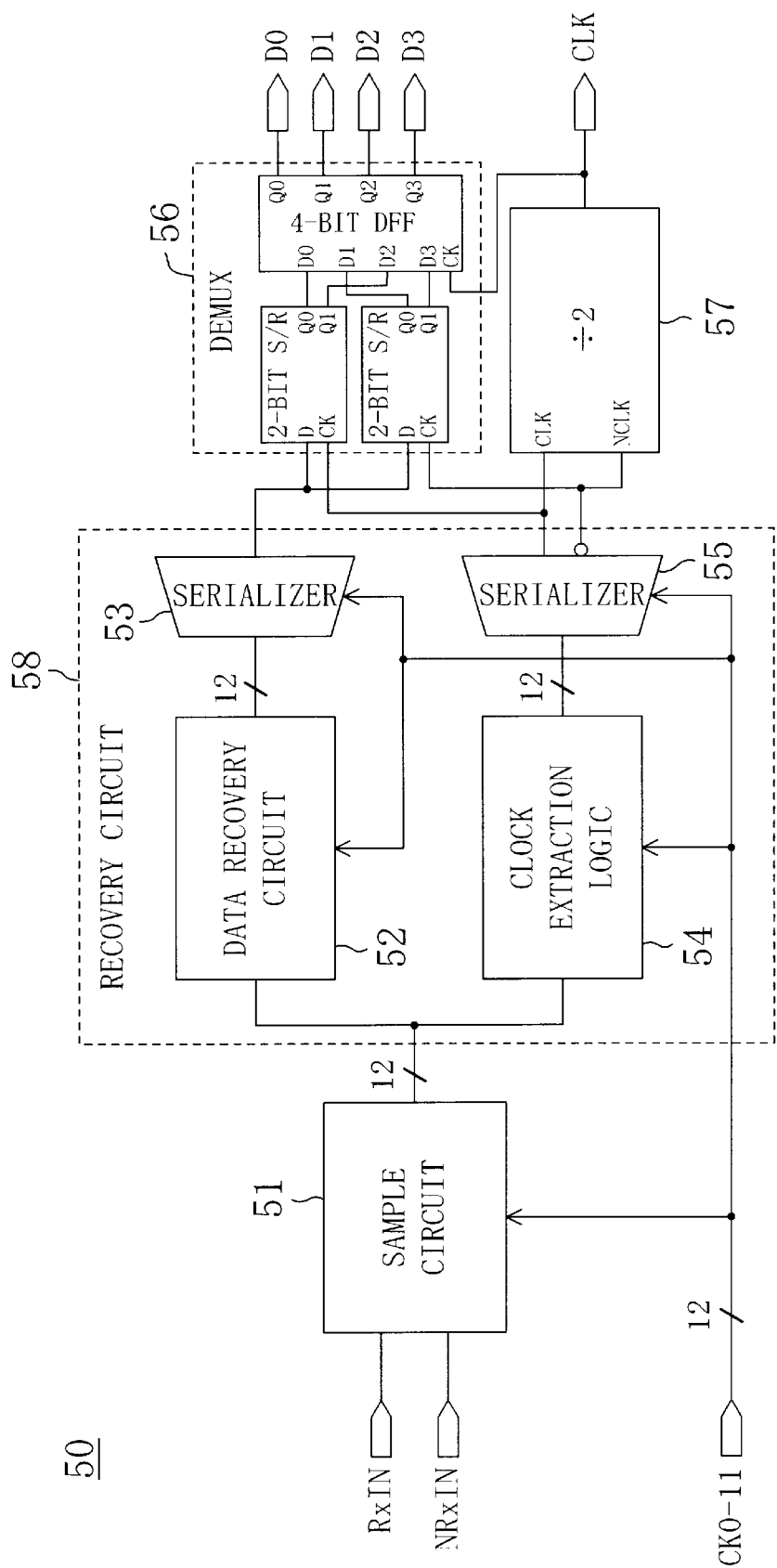
FIG. 15 is a block diagram showing an example of the structure of a serial-parallel conversion device according to the present invention.

FIG. 15 shows a serial-parallel conversion device 50 of the present invention. The serial-parallel conversion device 50 comprises a sample circuit 51, a recovery circuit 52 for recovery of data which has been quantized, a demultiplexer (DEMUX) 56 which receives data from the recovery circuit 52 through a serializer 53 and a positive and a negative clock extracted in extraction logic 54 through a serializer 55 for parallel expansion of the data, and a ½ divider circuit 57 for dividing the frequency of the extracted clock. The sample circuit 51 has a configuration of FIG. 5. The clock extraction logic 54 has a configuration of FIG. 7. Reference numeral 58 represents a full digital recovery circuit which is a collection of the data recovery circuit 52, the clock extraction logic 54, and the serializers 53 and 55.

Figure 16:
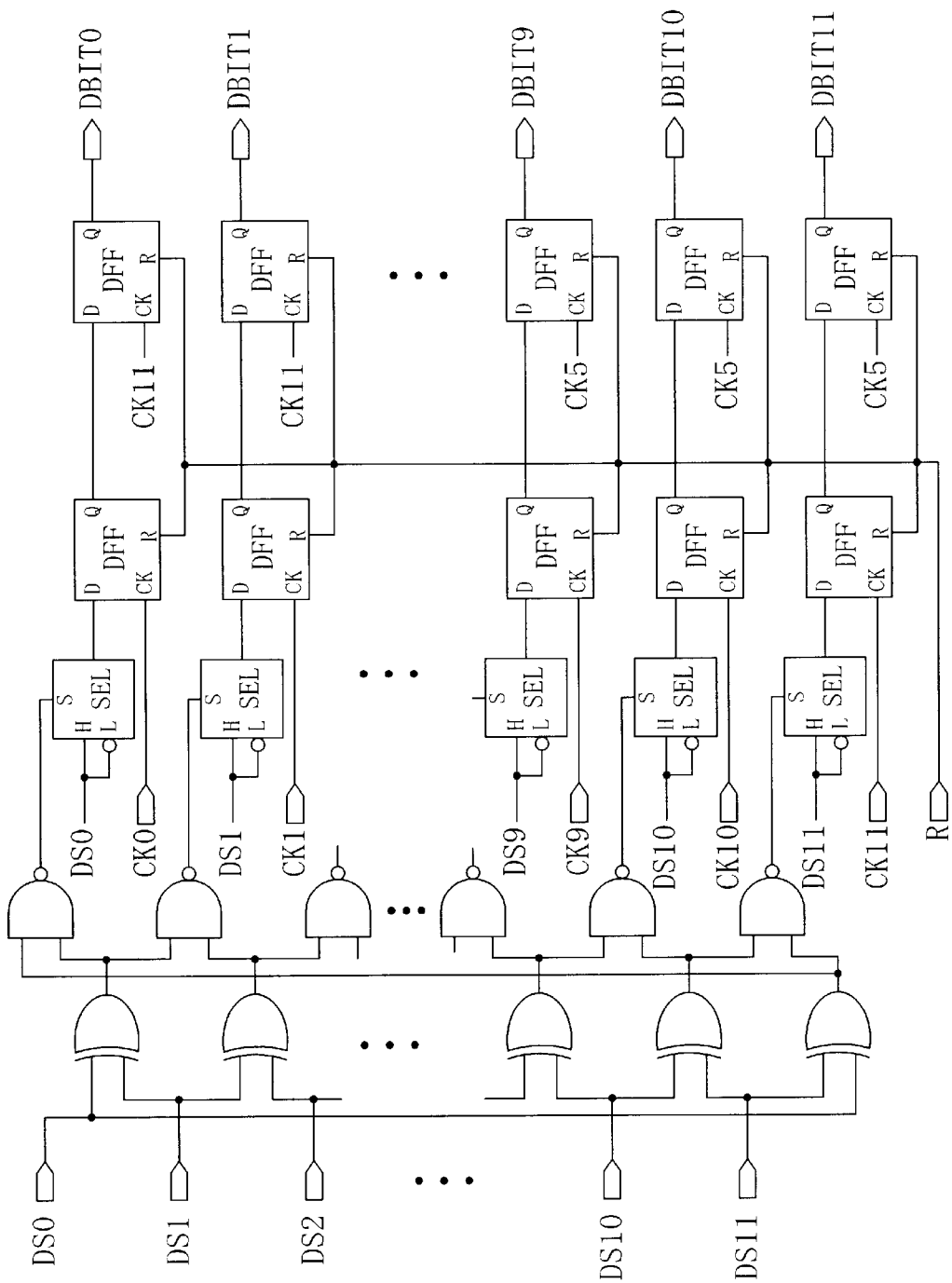
FIG. 16 is a circuit diagram showing in detail the structure of a data recovery circuit in FIG. 15.

As shown in FIG. 16, the data recovery circuit 52 is given a function of detecting a single bit by EXOR and NAND. Such a single bit is purged as noise.

In the demultiplexer 56, a pair of 2-bit shift registers (S/R) sequentially latch and shift recovered data by the extracted clock. The outputs of the shift registers are latched by a 4-bit DFF by a divided-by-2 clock from the divider circuit 57 and provided in the form of 4-bit data.

According to the serial-parallel conversion device 50, extraction of a clock having a frequency one half the data rate is achieved and, in addition, there is established a perfect synchronization between the data and the clock within the chip, so that safe, reliable data expansion can be realized.

Figure 17:
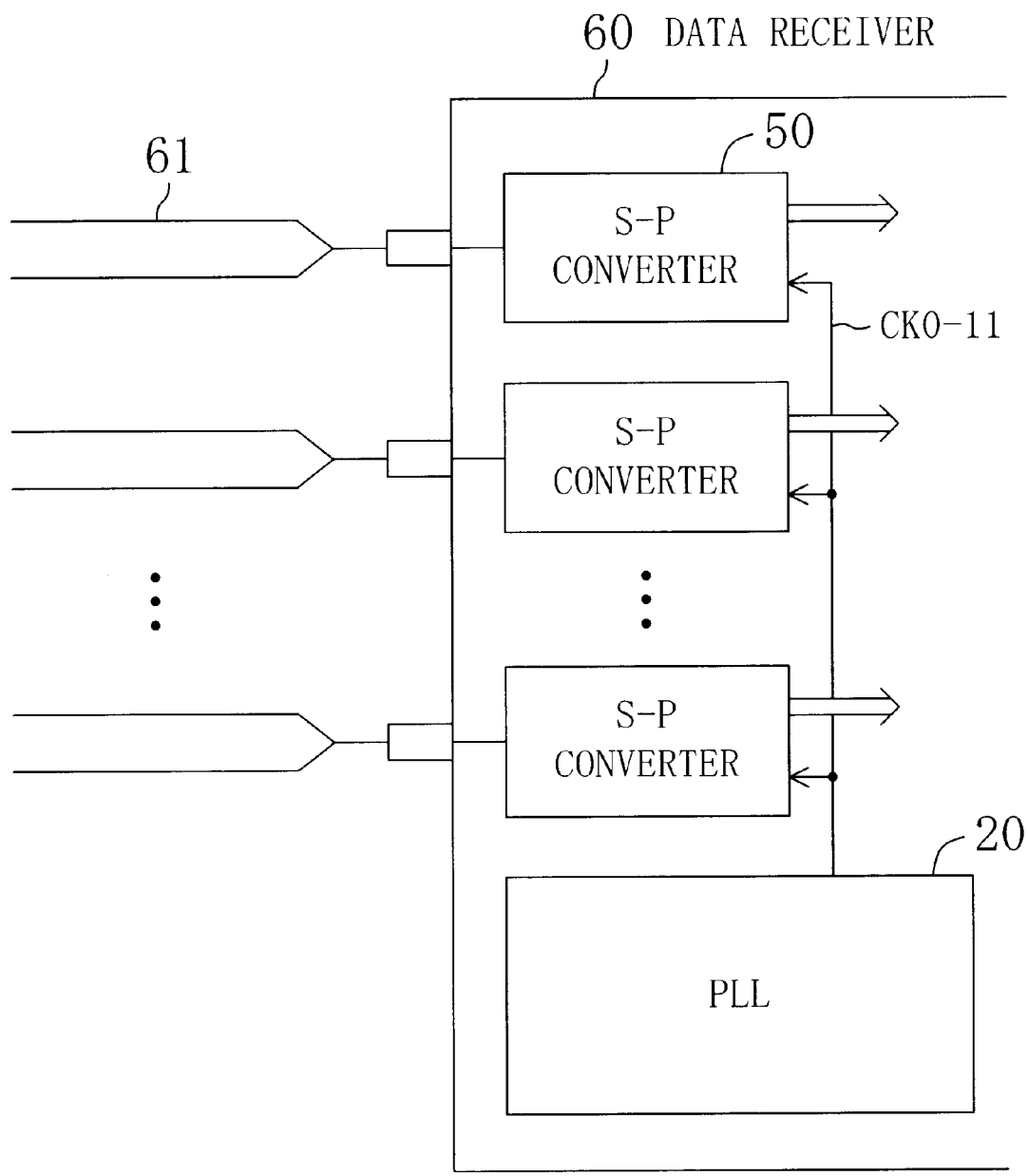
FIG. 17 is a block diagram showing an example of the structure of a data receiver device according to the present invention.

As shown in FIG. 17, a plurality of the serial-parallel conversion devices 50 are disposed and these conversion devices are operated by the clocks CK0–11 from the common PLL 20 (FIG. 2). This forms a data receiver device 60 suitable for integration and having a plurality of ports coupled to their respective signal lines 61 and the single PLL 20.

The present invention is considerably effective for burst data (i.e., for data which is input asynchronously and suddenly), so that there is no unsuccessful data acquisition. In other words, when the clock extraction logic 54 of FIG. 15 is used on the receiver side, a boundary is always specified by making reference to a transient point of the input data. The boundary becomes an edge of the extracted clock by the serializer 55. Therefore, an edge suitable for latching input data is always selected for the extracted clock. For example, if a transient point lies nearby, a point next to the transient point becomes a boundary which then becomes a clock edge. If no transient point lies nearby, or if the run length of a 0 value bit or a 1 value bit in the input data is not less than 2, the third point from a nearest boundary (because of 3-times oversampling in this example) is sequentially chosen as the next boundary to become a clock edge.

Figure 18A:
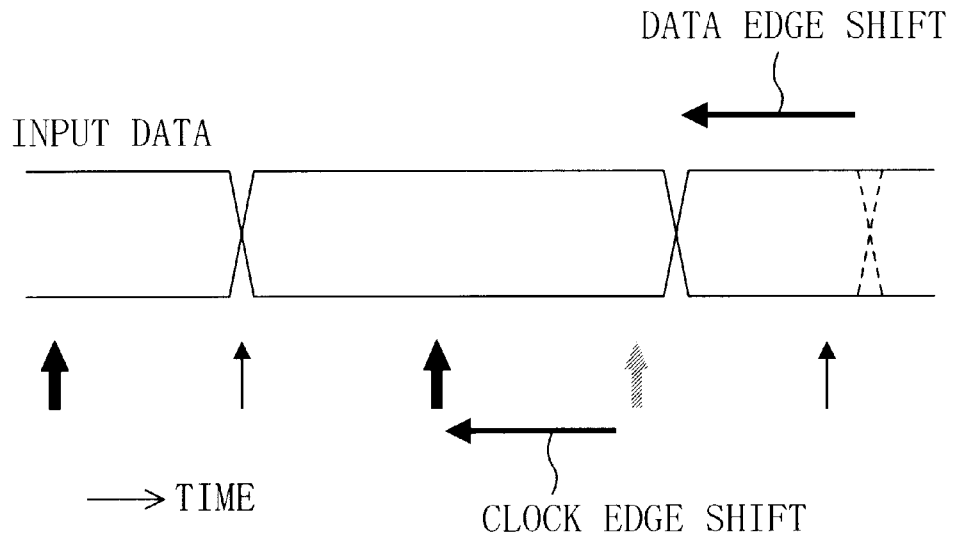
FIGS. 18A and 18B are explanatory diagrams for the description of the operation of the data receiver device in FIG. 17.
Figure 18B:
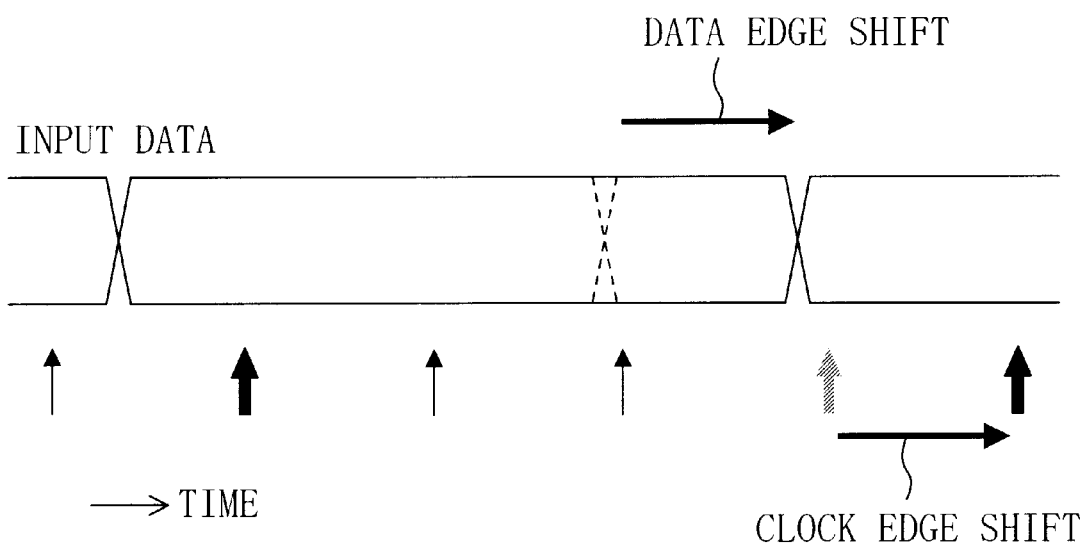

When burst data is suddenly input to a receiver, extraction of a clock is performed to a transient point of the data in serial-parallel conversion within the receiver. That is, there is no edge of the data (transient point) during the burst interval, so that the third point is sequentially used as a boundary to select a clock edge for extraction of a clock. However, upon the creation of a transient point caused by sudden input of data, if the transient point comes earlier in time than the third point, then a boundary is set so that a clock edge is likewise shifted forward for extraction of a clock, as shown in FIG. 18A. On the other hand, if the transient point comes later in time than the third point, then a boundary point is set so that a clock edge is likewise shifted backward for extraction of a clock, as shown in FIG. 18B. Because of this, hold-time and setup-time for receiving of data are always guaranteed.

Therefore, according to the present invention, it is possible to receive data in safe and reliable manner from the first bit thereof in burst data transmission. This eliminates the need for the provision of a lengthy preamble period for phase adjustment, thereby providing improvement in data transmission efficiency.

Figure 19:
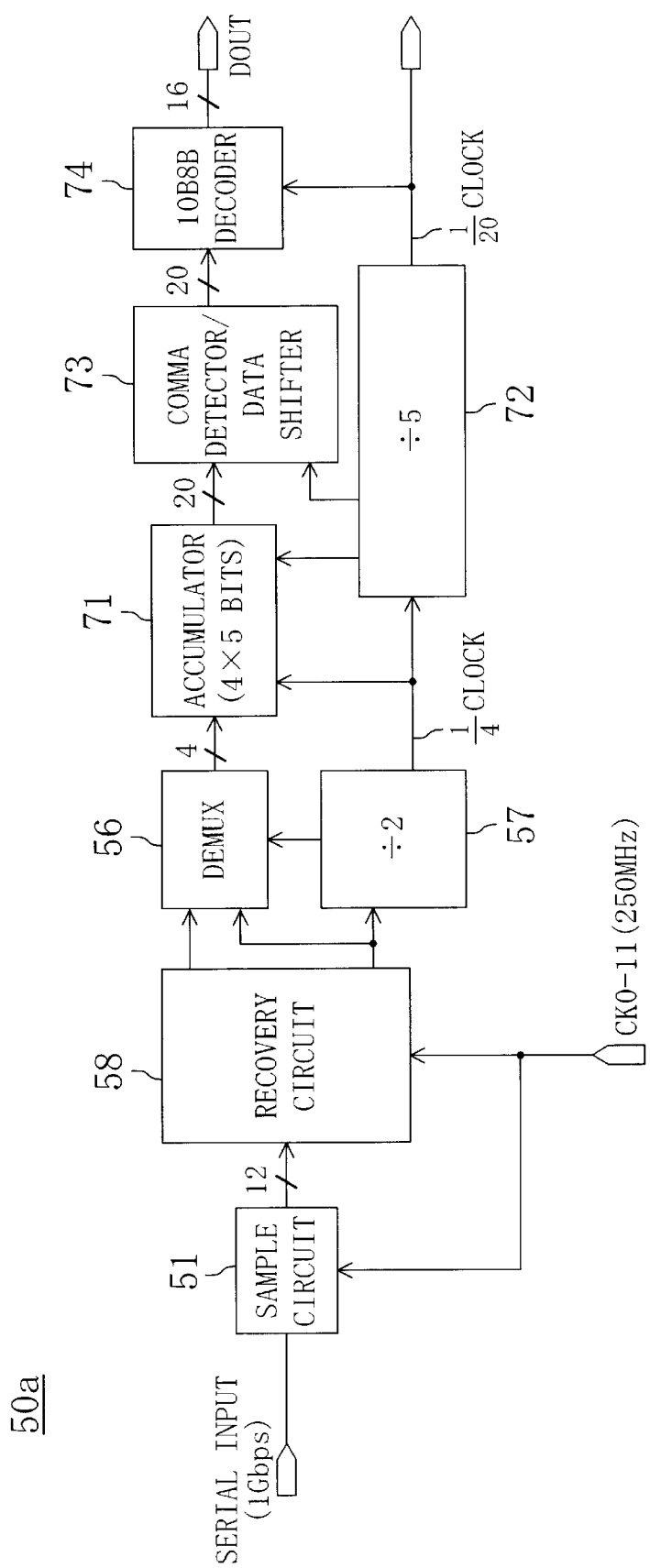
FIG. 19 is a block diagram showing an example of the structure of another serial-parallel conversion device according to the present invention.

FIG. 19 shows a serial-parallel conversion device of the present invention suitable for burst data transmission. The serial-parallel conversion device 50a of FIG. 19 comprises, in addition to the sample circuit 51, the recovery circuit 58, the demultiplexer 56, and the ½ divider circuit 57 in FIG. 15, an accumulator 71 by which data expanded to four bits in the demultiplexer 56 is accumulated five times and sequentially provided in the form of 20-bit data, a ⅕ divider circuit 72 for generation of a clock in synchronization with the 20-bit data from the accumulator 71, a comma detector/data shifter 73 which determines whether the 20-bit data from the accumulator 71 contains a comma pattern (1010000011) which is a specific pattern of ten bits and shifts, when such a comma pattern is specified, the 20-bit data so that the comma pattern becomes either the high-order 10 bits or the low-order 10 bits of the 20-bit data, and a 10B8B decoder 74 which decodes 8B10B encoding by the use of the 20-bit data from the comma detector/data shifter 73, to restore 16-bit data.

Figure 20:
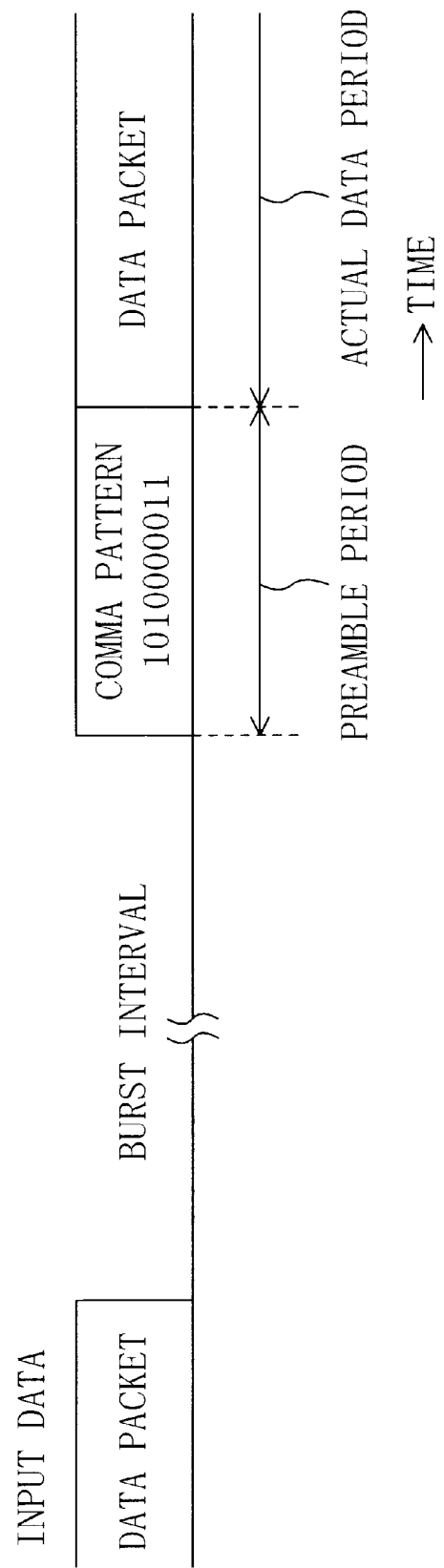
FIG. 20 is an explanatory diagram for the description of the operation of the serial-parallel conversion device of FIG. 19.

Because of such arrangement, as shown in FIG. 20, if the aforesaid comma pattern of ten bits is set as a preamble period after the burst interval, this allows the serial-parallel conversion device 50a to replace a conventional, lengthy preamble period used for phase adjustment by a shorter preamble period used for data alignment. Further, in an actual data period, the serial-parallel conversion device 50a is able to expand a data packet in the form of parallel data having a bit arrangement intended by the sending side. In each of the embodiments, the sampling count is set to a value of three in oversampling. However, the sampling count can be changed to a suitable one depending upon the specification or the like. For instance, if the sampling count is increased and the concept of the present invention is applied, this makes it possible to extract in more detail a clock for improvement in the duty ratio of the extracted clock. However, if the sampling count is increased, this requires circuits corresponding to the increased sampling count, resulting in increase in circuit scale. Accordingly, taking into account the duty ratio of an extracted clock required and the circuit scale, the sampling count must be set to an optimal value.

What is claimed is:

1. A clock extraction device comprising:
a data sampler part for quantizing incoming serial data by N times oversampling where N is a predetermined number;
a data divider part for dividing a datastream obtained by quantization in said data sampler part into a plurality of groups on the basis of transient points in said datastream and of said number N; and
a clock generator part for generating a clock on the basis of boundaries of said plurality of groups obtained by said data divider part, wherein said generated clock is supplied for latching data recovered from said datastream obtained by said quantization.

2. A clock extraction device comprising:
a data sampler part for quantizing incoming serial data by N times oversampling where N is a predetermined number;
a first converter part for producing from a first datastream obtained by quantization in said data sampler part a second datastream which specifies transient points in said first datastream;
a second converter part for producing from said second datastream a third datastream which specifies boundaries based on transient points in said second datastream and on said number N; and
a clock generator part for generating a clock on the basis of boundaries in said third datastream, wherein said generated clock is supplied for latching data recovered from said first datastream obtained by said quantization.

3. The clock extraction device of claim 2, wherein said third datastream is produced by:
making reference to an N-th bit from each of said transient points in said second datastream and to bits in front of and behind said N-th bit;
if there exists no transient point in any one of said bits, determining said N-th bit as a boundary; and
if there exists a transient point in either one of said bits, determining said transient point bit as a boundary.

4. The clock extraction device of claim 2,
wherein said third datastream has boundary bits different in logical value from the other bits; and
wherein said clock is generated by a time-series EXOR of bits in said third datastream.

5. A clock extraction method comprising the steps of:
quantizing incoming serial data by N times oversampling where N is a predetermined number;
dividing a datastream obtained by said quantization step into a plurality of groups on the basis of transient points in said datastream and of said number N;

generating a clock on the basis of boundaries of said plurality of groups in said datastream, and supplying said generated clock for latching data recovered from said datastream obtained by said quantization step.

6. A clock extraction method comprising the steps of:

quantizing incoming serial data by N times oversampling where N is a predetermined number;

producing from a first datastream obtained in said quantization step a second datastream which specifies transient points in said first datastream;

producing from said second datastream a third datastream which specifies boundaries based on transient points in said second datastream and on said number N;

generating a clock on the basis of boundaries in said third datastream, and supplying said generated clock for latching data recovered from said first datastream obtained by said quantization step.

7. A serial-parallel conversion device comprising:

a clock extraction circuit including (a) a data sampler part for quantizing incoming serial data by N times oversampling where N is a predetermined number, (b) a first converter part for producing from a first datastream obtained by quantization in said data sampler part a second datastream which specifies transient points in said first datastream, (c) a second converter part for producing from said second datastream a third datastream which specifies boundaries based on transient points in said second datastream and on said number N, and (d) a clock generator part for generating a clock on the basis of boundaries in said third datastream;

a data recovery circuit for recovering input data from said first datastream; and a dermultiplex circuit for latching said input data recovered by said data recovery circuit by means of said clock extracted by said clock extraction circuit and for expanding the latched input data into a predetermined number of bits.

8. The serial-parallel conversion device of claim 7 further comprising:

a pattern decision circuit which sequentially receives expanded data obtained by expansion of input data into a predetermined number of bits in said demultiplex circuit and determines whether there exists data having a specific pattern; and a data shift circuit which shifts, when said pattern decision circuit determines that there exists said specific patterns said expanded data so that said specific pattern is aligned and output as data of said predetermined number of bits.

9. The serial-parallel conversion device of claim 8 further comprising a decode circuit which decodes encoding of said expanded data shifted by said data shift circuit.

10. The serial-parallel conversion device of claim 8, wherein said input data is burst data and is assigned said specific pattern during a preamble period of said burst data.

11. A data receiver device comprising a plurality of said serial-parallel conversion devices of claim 7, wherein said conversion devices are operated by a clock from a common phase-locked loop.

* * * * *

UNITED STATES PATENT AND TRADEMARK OFFICE
CERTIFICATE OF CORRECTION

PATENT NO. : 6,735,710 B1
DATED : May 11, 2004
INVENTOR(S) : Takefumi Yoshikawa

It is certified that error appears in the above-identified patent and that said Letters Patent is hereby corrected as shown below:

Title page, Item [54] and Column 1, lines 1-4,
Title change "CLOCK EXTRACTION DEVICE" to -- A CLOCK EXTRACTION DEVICE TO ACHIEVE EXTRACTION OF DIFFERENT CLOCKS CORRESPONDING TO A PLURALITY OF INPUT PORTS RESPECTIVELY WITH A COMMON PHASE LOCKED LOOP --

Signed and Sealed this

Nineteenth Day of October, 2004

JON W. DUDAS
*Director of the United States Patent and Trademark Office*